United States Patent
Margulis

(10) Patent No.: US 9,299,872 B2
(45) Date of Patent: Mar. 29, 2016

(54) SYSTEM AND METHOD FOR REDUCING DARK CURRENT DRIFT IN A PHOTODIODE BASED ELECTRON DETECTOR

(71) Applicant: APPLIED MATERIALS ISRAEL, LTD., Rehovot (IL)

(72) Inventor: Pavel Margulis, Ashdod (IL)

(73) Assignee: Applied Materials Israel, Ltd., Rehovot (IL)

( * ) Notice: Subject to any disclaimer, the term of this patent is extended or adjusted under 35 U.S.C. 154(b) by 253 days.

(21) Appl. No.: 14/089,571

(22) Filed: Nov. 25, 2013

(65) Prior Publication Data
US 2015/0145090 A1 May 28, 2015

(51) Int. Cl.
*H01L 31/105* (2006.01)
*H01L 31/0216* (2014.01)
*H01L 31/0224* (2006.01)

(52) U.S. Cl.
CPC ........ *H01L 31/105* (2013.01); *H01L 31/02164* (2013.01); *H01L 31/022416* (2013.01)

(58) Field of Classification Search
CPC ... H01L 31/105; H01L 31/075; H01L 31/118; H01L 31/1185; H01L 29/868; G01T 1/24; G01T 1/244
See application file for complete search history.

(56) References Cited

U.S. PATENT DOCUMENTS

| | | | |
|---|---|---|---|
| 2010/0155910 A1* | 6/2010 | Gaebler | H01L 27/1462 257/649 |
| 2010/0201442 A1* | 8/2010 | Akaiwa | H03F 1/3247 330/149 |

* cited by examiner

*Primary Examiner* — Jose R Diaz
(74) *Attorney, Agent, or Firm* — Kilpatrick Townsend & Stockton LLP

(57) ABSTRACT

A sensing element that may include (a) a PIN diode that may include an anode that is coupled to an anode contact; a cathode that is coupled to a cathode contact; a semiconductor portion that has a sensing region; and an insulator that is positioned between the cathode contact and the anode contact; and (b) a shielding element. The insulator, the cathode contact and the anode contact are positioned between the shielding element and the semiconductor portion. The shielding element is shaped and positioned to facilitate radiation to impinge onto the sensing region of the semiconductor portion while at least partially shielding the insulator from electrons that are emitted from the sensing region.

18 Claims, 5 Drawing Sheets

SYSTEM AND METHOD FOR REDUCING DARK CURRENT DRIFT IN A PHOTODIODE BASED ELECTRON DETECTOR

BACKGROUND OF THE INVENTION

FIG. 1 illustrates a prior art PIN diode 10. PIN diode 10 includes an anode that is connected to an upper anode contact 12 and to a lower anode contact 12', a cathode that is connected to a cathode contact 11, a semiconductor portion 20 that has a sensing region and an insulator 13 that is arranged to insulate the cathode contact from the upper anode contact 12. The insulator 13 and cathode contact 11 contact the upper surface of the semiconductor portion 20.

Upper anode contact 12 contacts the upper surface of the semiconductor portion 20 while the lower anode contact 12' contacts the lower surface of the semiconductor portion 20—especially it contacts the lower surface of the substrate 24.

The semiconductor portion 20 includes a negative doped (n-type) cathode layer 21, an intrinsic layer 22, a positive doped (p-type) anode layer 23, a highly positive doped (P+ type) substrate 24, a highly negative doped (N+ type) region 25 and a highly positive doped (P+ type) region 26. FIG. 1 illustrates the n-type cathode layer 21 as being coated with a layer 27.

An upper surface of the n-type layer 21 is positioned below the layer 27 and defines the upper surface of a sensing region of the PIN diode 10. The sensing region may also include portions of the intrinsic layer 22 and the p-type layer 23.

The cathode contact 11 and the upper anode contact 12 are coupled to the N+ type and P+ type regions 25 and 26 respectively.

The n-type layer 21 is the cathode and it is coupled to the cathode contact 11 via the N+ type region 25.

The p-type layer 23 is the anode. The anode is coupled to the upper anode contact 12 via the P+ type region 26 and is coupled to the lower anode contact 12' via substrate 24. Insulator 13 is positioned between the upper anode contact 12 and cathode contact 11. The N+ type region 25 may surround the n-type layer 21 and may also contact the intrinsic layer 22 and the p-type layer 23.

When PIN diode 10 is used as electron detector it is aimed to detect primary electrons (PE) that propagate in a vacuumed environment towards the PIN diode. Arrow 30 illustrates a primary electron that impinges on layer 27.

When the primary electron hits the active area (sensing region) of the PIN diode 10 it may create an electron\hole pair in the PIN junction formed by layers 21, 22 and 23.

The PIN diode 10 is biased by a reversed bias. Due to the applied reversed bias the electrons\holes pairs flow in the PIN junction and create a current signal through the PIN diode 10.

An inevitable byproduct of the primary electron interaction with the PIN diode 10 is the emission of electrons such as secondary electrons and backscattered electrons from the PIN diode 10 to the vacuum. The emitted electrons can interact again with various areas of the PIN diode—including the sensing region (see arrow 31) or with insulator 13 (see arrow 32). The trajectory of the emitted electrons in the vacuumed environment is a function of the electric field in the vicinity of the front surface of the PIN diode, the energy and exit angle of the emitted electrons.

The impingement of the emitted electrons on the PIN diode can cause unwanted results.

If, the emitted electron impinges on the insulator 13 it may charge the insulator 13 positively or negatively (depends on the energy of the emitted electron) and can create undesired electric potential on the insulator 13. This electric potential may remain even after the signal is ended, due to the very low charge mobility in insulator 13. This electric potential may act as a gating potential on the PIN diode 10 and may open a new current channel between 25 and 26 in parallel to the PIN junction. This undesired conductance channel will create a new parasitic dark current which will be added to the signal that flows in the junction. The parasitic dark current can be extremely large and might change the output signal of the PIN diode 10 dramatically.

There is a growing need to provide a sensing element with lower dark current.

BRIEF SUMMARY OF THE INVENTION

According to various embodiments of the invention there may be provided a sensing element that may include a PIN diode that may include an anode that is coupled to an anode contact, a cathode that is coupled to a cathode contact, a semiconductor portion that has a sensing region, and an insulator that may be arranged to insulate the cathode contact from the anode contact; and a shielding element; wherein the insulator, the cathode contact and the anode contact are positioned between the shielding element and the semiconductor portion; wherein the shielding element may be shaped and positioned to facilitate radiation to impinge onto the sensing region of the semiconductor portion while at least partially shielding the insulator from electrons that are emitted from the sensing region.

The shielding element may have an aperture that is positioned above the sensing region.

The shielding element may include a cathode conductor that may be coupled to the cathode contact and an anode conductor that may be coupled to the anode contact.

Each of the cathode and anode conductors may have an end that may be formed at an exterior of the shielding element.

The cathode and anode conductors may be isolated from each other.

The cathode and anode conductors may be coupled to an insulating element of the shielding element.

The cathode and anode conductors may be coupled to exterior facets of the insulating element of the shielding element.

The sensing region may be circular and wherein the shielding element may have a circular symmetry.

The shielding element may be shaped and positioned to partially shield the insulator from the electrons that are emitted from the sensing region.

The shielding element may be shaped and positioned to completely shield the insulator from the electrons that are emitted from the sensing region.

The shielding element may include a ceramic plate that may be partially plated with metal anode and cathode conductors.

Any combinations of any of the components of any of the figures can be provided. Any combination of any of the mentioned above systems can be provided.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

Figure 1:
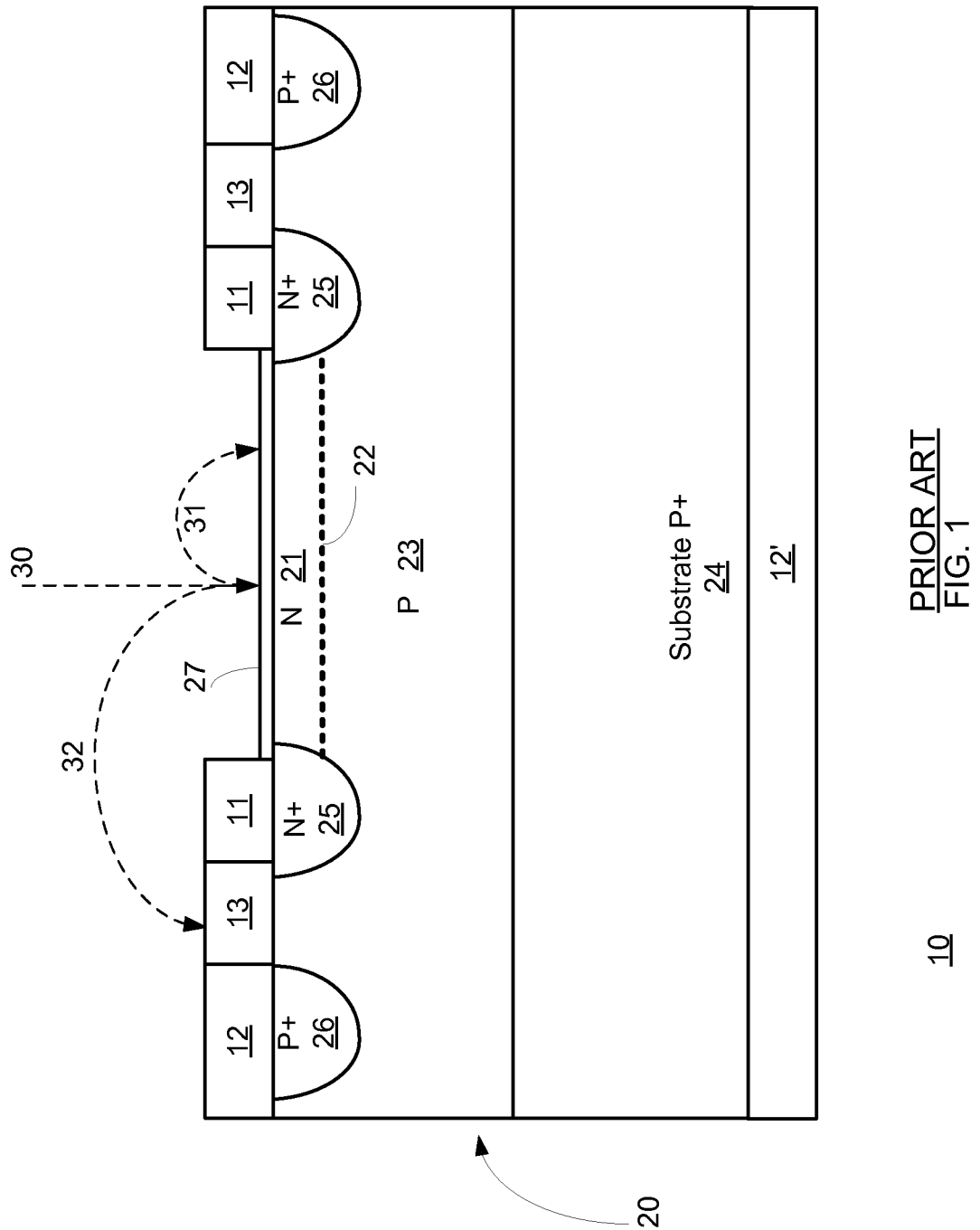
FIG. 1 is a cross sectional view of a prior art sensing element.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The assignment of the same reference numbers to various components may indicate that these components are similar to each other.

Figure 2:
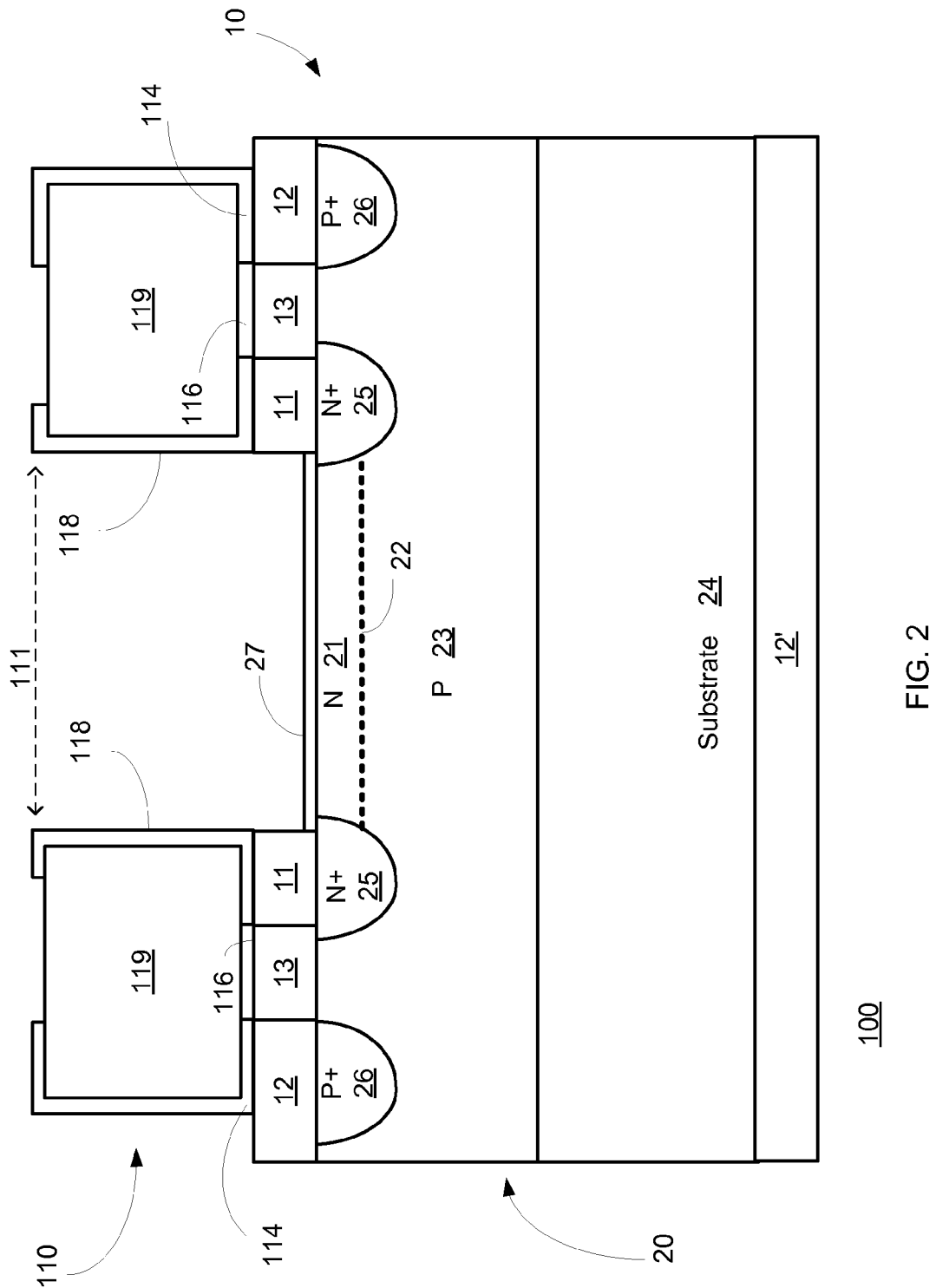
FIG. 2 is a cross sectional view of a sensing element according to an embodiment of the invention.
Figure 3:
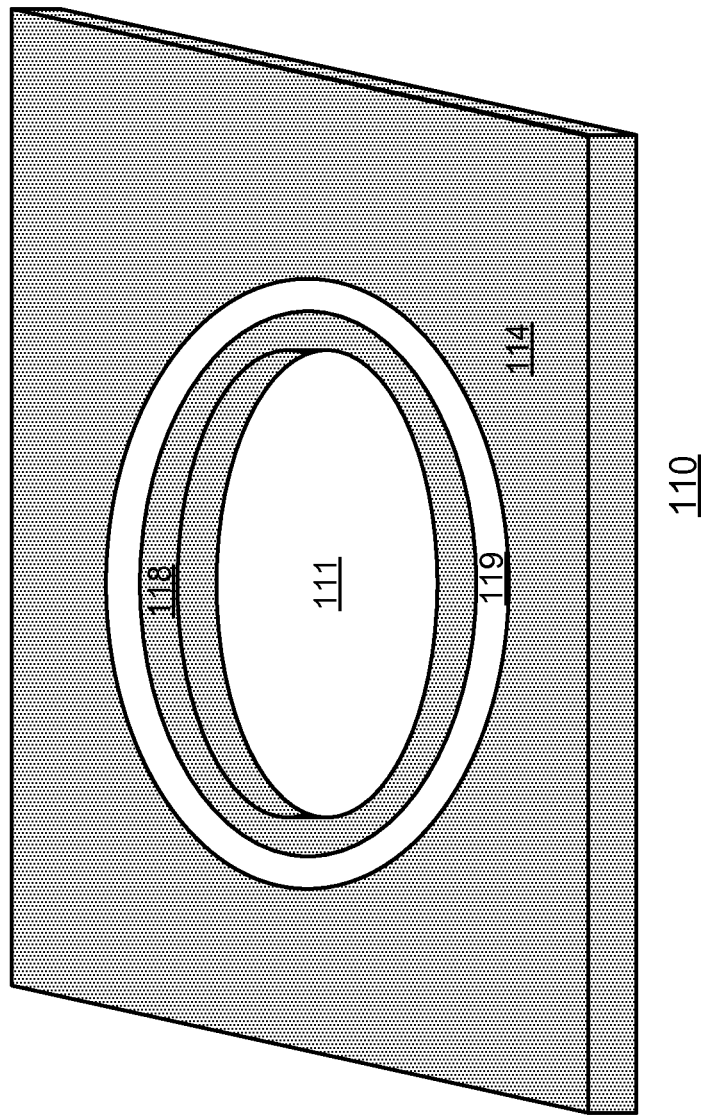
FIG. 3 illustrates a shielding element according to an embodiment of the invention.

FIG. 2 is a cross sectional view of a sensing element 100 according to an embodiment of the invention. FIG. 3 is an isometric view of a shielding element 110 according to an embodiment of the invention.

Sensing element 100 includes:
1. A PIN diode 10 that includes an anode that is coupled to an upper anode contact 12 and a lower anode contact 12', a cathode that is coupled to a cathode contact 11, a semiconductor portion 20 that has a sensing region and an insulator 13 that is arranged to insulate the cathode contact from the anode contact.
2. Shielding element 110.

The insulator 13, the cathode contact 11 and the upper anode contact 12 are positioned between the shielding element 110 and the semiconductor portion 20. If the sensing region of the PIN diode 10 faces upwards then the shielding element 110 can be viewed as belong located above the cathode contact 11, the upper anode contact 12 and the insulator 13.

The shielding element 110 is shaped and positioned to facilitate radiation to impinge onto the sensing region of the semiconductor portion 20 while at least partially shielding the insulator 13 from electrons that are emitted from the sensing region.

FIG. 2 illustrates the shielding element 110 as including (or as defining) an aperture 111 that is positioned above the sensing region.

In order to facilitate electrical coupling of an external conductor (external to the PIN diode) to the PIN diode 10 the shielding element may include a cathode conductor 118 that is coupled to the cathode contact 11 and an anode conductor 114 that is coupled to the upper anode contact 12.

The cathode conductor 118 may include a lower plate, a vertical plate and an upper plate. The upper plate may be formed above the upper surface of the shielding element 110 to enable electrical coupling to an external conductor.

The anode conductor 114 may have a lower plate, an upper plate and a vertical plate. The upper plate may be formed at an exterior of the shielding element 110 to enable electrical coupling to an external conductor.

Each conductor of the cathode and anode conductors may have a different shape, more or less plates and the like.

The cathode and anode conductors 118 and 114 are isolated from each other. FIG. 2 illustrates a gap 116 formed between the cathode and anode conductors 114 and 118. This gap 116 can remain empty or filled with isolating material. The gap 116 may be formed above insulator 13.

The cathode and anode conductors 118 and 114 may be coupled to an insulating element 119 of the shielding element 110.

FIG. 2 illustrates the cathode and anode conductors 114 and 118 as being coupled to exterior facets of the insulating element 119 of the shielding element 110.

The cathode and anode conductors 114 and 118 may be smaller (for example may have a smaller width) than the insulating element 119 of the shielding element 110.

The shielding element 110 may be thicker than the insulator 13.

Higher shielding elements may inherently provide better shielding of the insulator 13 from the emitted electrons—as the emitted electrons must overcome a height barrier formed by the shielding element before landing on the insulating element 119 and charging it and even charge insulator 13.

It is noted that even if an emitted electrode impinges on the upper surface of insulating element 110 and charges the insulating element—the effect on the PIN diode 10 is much smaller as the upper surface of the insulating element 119 is more distant from the semiconductor portion 20 than the upper surface of the insulator 13.

The sensing region may be circular and the shielding element 110 may exhibit a circular symmetry.

The cathode and anode conductors 114 and 118 can be bonded or welded to the PIN diode 10. The insulating element 119 can be made of $Al_2O_3$ alumina ceramics or other insulating materials and the cathode and anode conductors 114 and 118 can be made of gold or other conducting materials.

FIG. 3 illustrates a shielding element 110 that includes (a) a ring shaped cathode conductor 118 that defines a circular aperture 111 that corresponds to the shape and size of the sensing region and (b) an anode conductor 114 having an annular shaped upper portion that is spaced apart from the upper portion of the cathode electrode 118. The radius of the aperture 111 can be about 2.5 millimeters, the height of the semiconductor portion 20 can be about 300 microns, the height of the native oxide layer 27 can be about 80 Angstroms, and the height of the shielding element 110 can be in range between 100 and 200 microns. Other dimensions can be provided.

Figure 4:
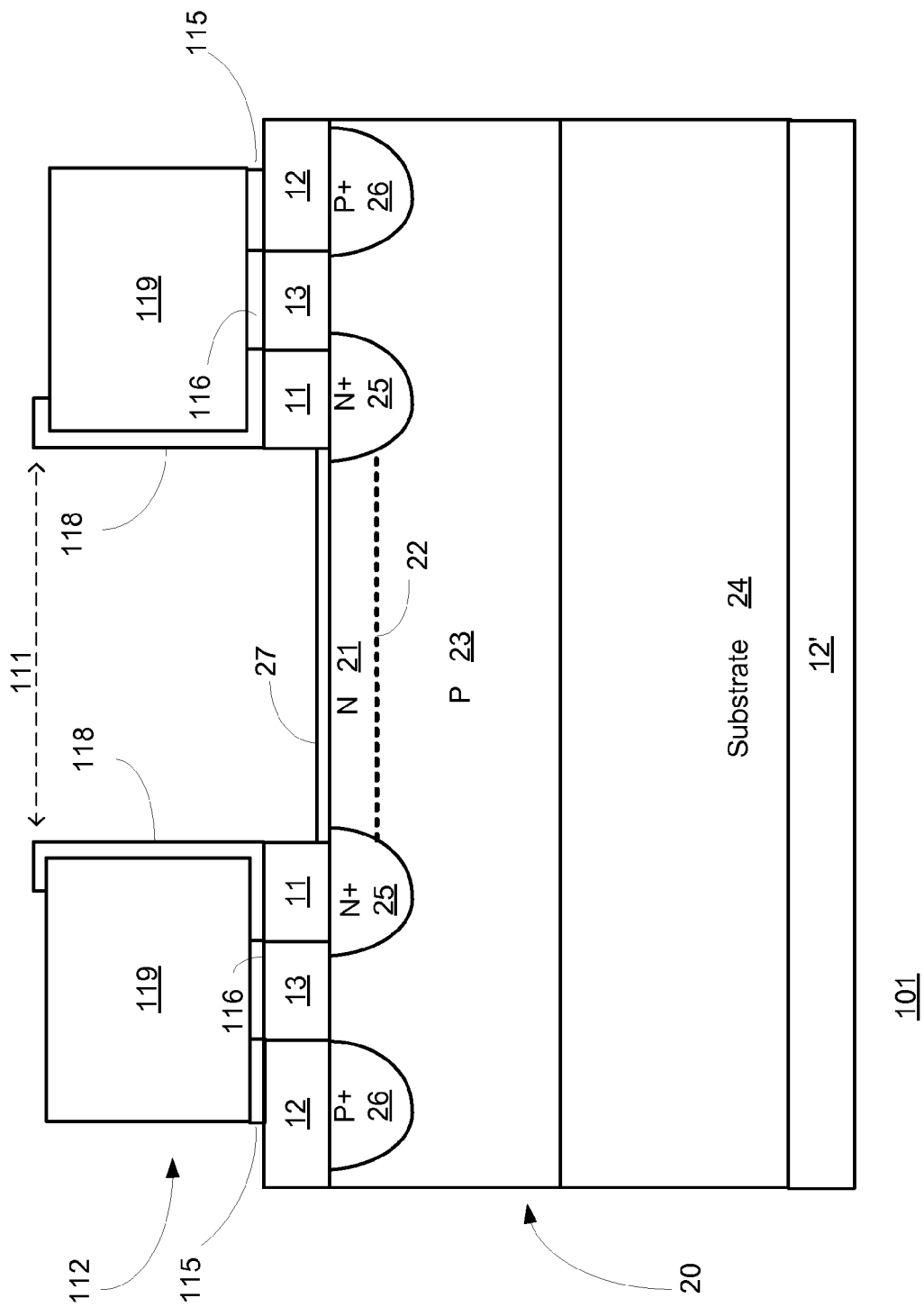
FIG. 4 is a cross sectional view of a sensing element according to an embodiment of the invention.
Figure 5:
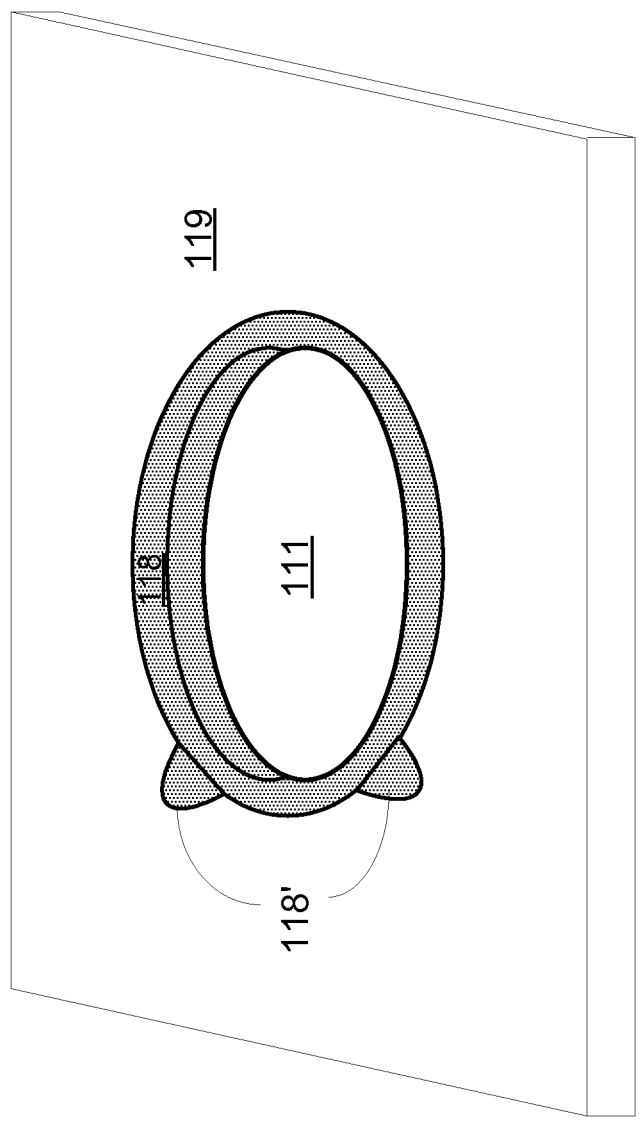
FIG. 5 illustrates a shielding element according to an embodiment of the invention.

FIG. 4 is a cross sectional view of a sensing element 101 according to an embodiment of the invention. FIG. 5 is a top view of a shielding element 112 according to an embodiment of the invention.

Sensing element 101 of FIG. 4 differs from sensing element 100 of FIG. 2 by having an anode conductor 115 that has only a lower portion—a plate shaped conductor that contacts the lower portion of the insulating element 119 while leaving the portions of the insulating element 119 above the anode exposed.

FIG. 5 illustrates a shielding element 112 that includes a ring shaped cathode conductor 118 that defines a circular aperture 111 that corresponds to the shape and size of the sensing region. The upper portion of the cathode conductor 118 may include structural elements such as "ears" 118' that facilitate bonding of the cathode conductor 118 to the external circuit. These "ears" may have different shapes and sizes and may be absent from the cathode conductor 118.

The radius of the aperture 111 can be about 2.5 millimeters, the height of the semiconductor portion 20 can be about 300 microns, the height of the layer 27 can be about 80 Angstroms, and the height of the shielding element 112 can be in range between 100 and 200 microns. Other dimensions can be provided.

In the foregoing specification, the invention has been described with reference to specific examples of embodiments of the invention. It will, however, be evident that various modifications and changes may be made therein without departing from the broader spirit and scope of the invention as set forth in the appended claims.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A sensing element, comprising:
 a PIN diode having an anode coupled to an anode contact, a cathode coupled to a cathode contact, a semiconductor portion that has a sensing region, and an insulator positioned between the cathode contact and the anode contact; and
 a shielding element comprising an anode conductor coupled to the anode contact and a cathode conductor coupled to the cathode contact, the anode conductor separated from the cathode conductor by an insulating element, wherein at least one of the anode conductor or the cathode conductor has a cross section with a substantially C-shape where a portion extends under a bottom of the insulating element, a portion extends along a side of the insulating element, and a portion extends over a top of the insulating element, and at least one of the portions is exposed along an exterior surface of the shielding element;
 wherein the insulator, the cathode contact and the anode contact are positioned between the shielding element and the semiconductor portion, and the shielding element is shaped and positioned to facilitate radiation to impinge onto the sensing region of the semiconductor portion while at least partially shielding the insulator from electrons that are emitted from the sensing region.

2. The sensing element according to claim 1 wherein the shielding element has an aperture that is positioned above the sensing region.

3. The sensing element according to claim 1 wherein each of the cathode and anode conductors has an end that is formed at an exterior of the shielding element.

4. The sensing element according to claim 1 wherein the cathode and anode conductors are isolated from each other.

5. The sensing element according to claim 1 wherein the cathode and anode conductors are coupled to the insulating element of the shielding element.

6. The sensing element according to claim 1 wherein the cathode and anode conductors are coupled to exterior facets of the insulating element of the shielding element.

7. The sensing element according to claim 1 wherein the sensing region is circular and wherein the shielding element has a circular symmetry.

8. The sensing element according to claim 1 wherein the shielding element is shaped and positioned to partially shield the insulator from the electrons that are emitted from the sensing region.

9. The sensing element according to claim 1 wherein the shielding element is shaped and positioned to completely shield the insulator from the electrons that are emitted from the sensing region.

10. The sensing element according to claim 1 wherein the shielding element comprises a ceramic plate that is partially plated with metal the anode and cathode conductors.

11. A sensing element, comprising:
 a PIN diode comprising a semiconductor portion having a cathode, an anode having an upper surface that defines an upper surface of a sensing region, an N+ region and a P+ region formed on a first side of a semiconductor substrate; a cathode contact formed on the semiconductor portion and coupled to the cathode through the N+ region; an upper anode contact formed on the semiconductor portion and coupled to anode through the P+ region; an insulator formed on the semiconductor portion between the cathode contact and the anode contact; and a lower anode contact on a second side of the semiconductor substrate opposite the first side; and a shielding element comprising an insulating element having a first surface that defines an aperture positioned above the sensing region and a second surface opposite the first surface, a cathode conductor formed on at least a portion of the first surface and coupled to the cathode contact, and an anode conductor formed on at least a portion of the second surface and coupled to the upper anode contact, wherein the anode conductor is separated from the cathode conductor by the insulating element, and at least one of the anode conductor or the cathode conductor has a cross section with a substantially C-shape where a portion extends under a bottom of the insulating element, a portion extends along a side of the insulating element, and a portion extends over a top of the insulating element, and at least one of the portions is exposed along an exterior surface of the shielding element;

wherein the insulator, the cathode contact and the anode contact are positioned between the shielding element and the semiconductor portion, and the shielding element is shaped and positioned to facilitate radiation to impinge onto the sensing region of the semiconductor portion while at least partially shielding the insulator from electrons that are emitted from the sensing region.

12. The sensing element according to claim 11 wherein the anode conductor is electrically isolated from the cathode conductor by a gap positioned above the insulator.

13. The sensing element according to claim 12 wherein the gap comprises dielectric material.

14. The sensing element according to claim 11 wherein the sensing region is circular and the shielding element has a circular symmetry.

15. The sensing element according to claim 11 wherein the shielding element is thicker than the insulator.

16. The sensing element according to claim 11 wherein the cathode and anode contacts are bonded or welded to the N+ and P+ regions, respectively.

17. The sensing element according to claim 11 wherein the insulating element comprises $Al_2O_3$.

18. The sensing element according to claim 11 wherein the PIN diode further comprises an oxide layer formed over the sensing region.

* * * * *